United States Patent
Hussain et al.

(10) Patent No.: US 8,030,688 B2
(45) Date of Patent: Oct. 4, 2011

(54) OHMIC METAL CONTACT PROTECTION USING AN ENCAPSULATION LAYER

(75) Inventors: Tahir Hussain, Calabasas, CA (US); Miroslav Micovic, Newbury Park, CA (US); Paul Hashimoto, Los Angeles, CA (US); Gary Peng, San Gabriel, CA (US); Ara K. Kurdoghlian, La Canada Flintridge, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/486,686

(22) Filed: Jun. 17, 2009

(65) Prior Publication Data

US 2009/0250725 A1    Oct. 8, 2009

Related U.S. Application Data

(62) Division of application No. 10/964,875, filed on Oct. 13, 2004, now Pat. No. 7,566,916, which is a division of application No. 10/634,348, filed on Aug. 4, 2003, now Pat. No. 6,884,704.

(60) Provisional application No. 60/401,414, filed on Aug. 5, 2002.

(51) Int. Cl.
*H01L 29/778* (2006.01)

(52) U.S. Cl. .......... 257/194; 257/192; 257/27; 257/368; 257/195

(58) Field of Classification Search .......... 257/192, 257/194, 195, 368, 27
See application file for complete search history.

(56) References Cited

U.S. PATENT DOCUMENTS

| | | | |
|---|---|---|---|
| 5,300,795 A | 4/1994 | Saunier et al. | 257/192 |
| 5,393,990 A | 2/1995 | Kohn | 257/12 |
| 5,696,389 A | 12/1997 | Ishikawa et al. | 257/99 |
| 5,739,558 A | 4/1998 | Ishida et al. | 257/192 |
| 5,760,418 A | 6/1998 | Lee et al. | 257/20 |
| 5,766,695 A | 6/1998 | Nguyen et al. | 427/553 |
| 5,929,467 A | 7/1999 | Kawai et al. | 257/192 |
| 6,100,548 A | 8/2000 | Nguyen et al. | 257/192 |
| 6,255,673 B1 | 7/2001 | Kuzuhara | 257/192 |

(Continued)

FOREIGN PATENT DOCUMENTS

EP    0899782 A2    3/1999

(Continued)

OTHER PUBLICATIONS

Konig, et al., "Enhancement Mode n-Channel Si/SiGe MODFET with a High Intrinsic Transconductance," *Electronics Letters*, vol. 28, No. 2, pp. 160-162, 1992.

(Continued)

*Primary Examiner* — Long Pham
(74) *Attorney, Agent, or Firm* — Ladas & Parry

(57) ABSTRACT

A method for fabricating a semiconductor device which protects the ohmic metal contacts and the channel of the device during subsequent high temperature processing steps is explained. An encapsulation layer is used to cover the channel and ohmic metal contacts. The present invention provides a substrate on which a plurality of semiconductor layers are deposited. The semiconductor layers act as the channel of the device. The semiconductor layers are covered with an encapsulation layer. A portion of the encapsulation layer and the plurality of semiconductor layers are removed, wherein ohmic metal contacts are deposited. The ohmic metal contacts are then annealed to help reduce their resistance. The encapsulation layer ensures that the ohmic metal contacts do not migrate during the annealing step and that the channel is not harmed by the high temperatures needed during the annealing step.

21 Claims, 8 Drawing Sheets

U.S. PATENT DOCUMENTS

| | | |
|---|---|---|
| 6,316,793 B1 | 11/2001 | Sheppard et al. ............... 257/103 |
| 6,391,696 B1 | 5/2002 | Onda ............................. 438/167 |
| 6,492,669 B2 | 12/2002 | Nakayama et al. ............ 257/282 |
| 0,218,183 A1 | 11/2003 | Micovic et al. ................ 257/192 |
| 2001/0013604 A1 | 8/2001 | Hase ................................ 257/12 |
| 2001/0023964 A1 | 9/2001 | Wu et al. ........................ 257/194 |
| 2004/0021152 A1 | 2/2004 | Nguyen et al. ................. 257/192 |
| 2004/0029330 A1 | 2/2004 | Hussain et al. ................ 438/172 |
| 2004/0094759 A1 | 5/2004 | Nguyen et al. .................. 257/24 |

FOREIGN PATENT DOCUMENTS

| | | |
|---|---|---|
| JP | 2002-016087 | 1/2002 |
| WO | 01/13436 A1 | 2/2001 |
| WO | 01/57929 A1 | 8/2001 |

OTHER PUBLICATIONS

U.S. Appl. No. 10/600,521, filed Jun. 19, 2003, Nguyen et al.

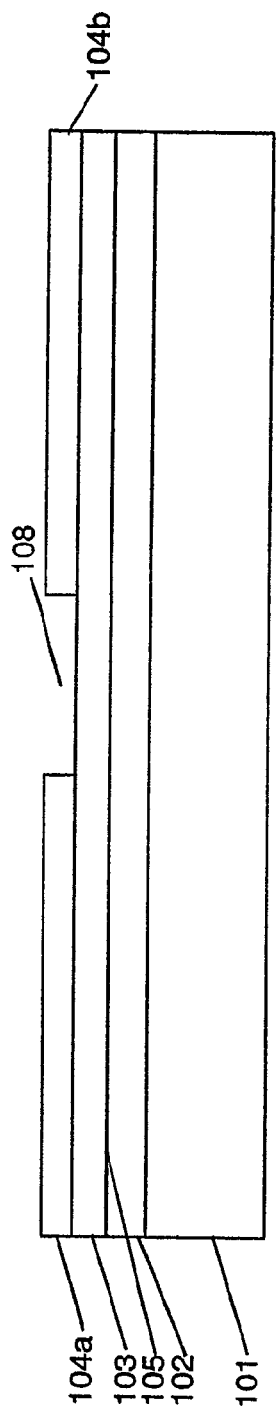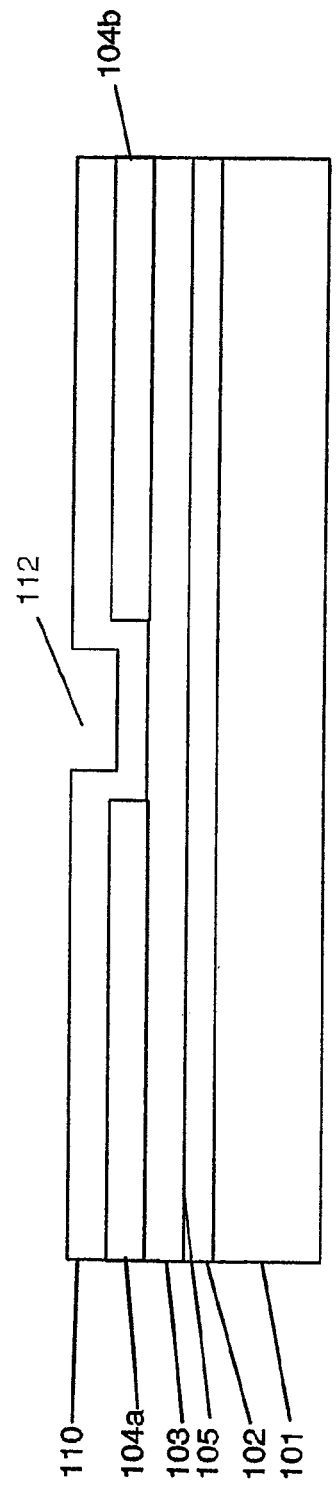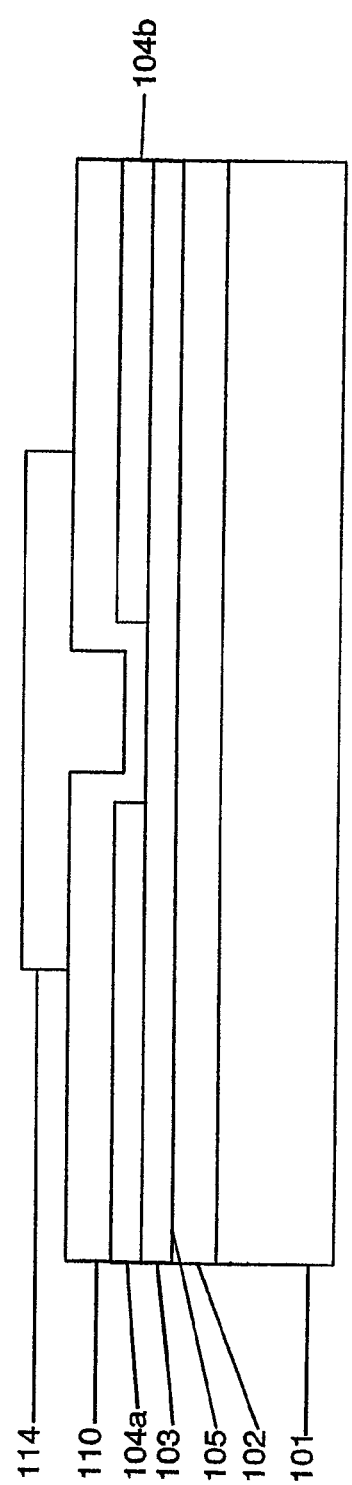

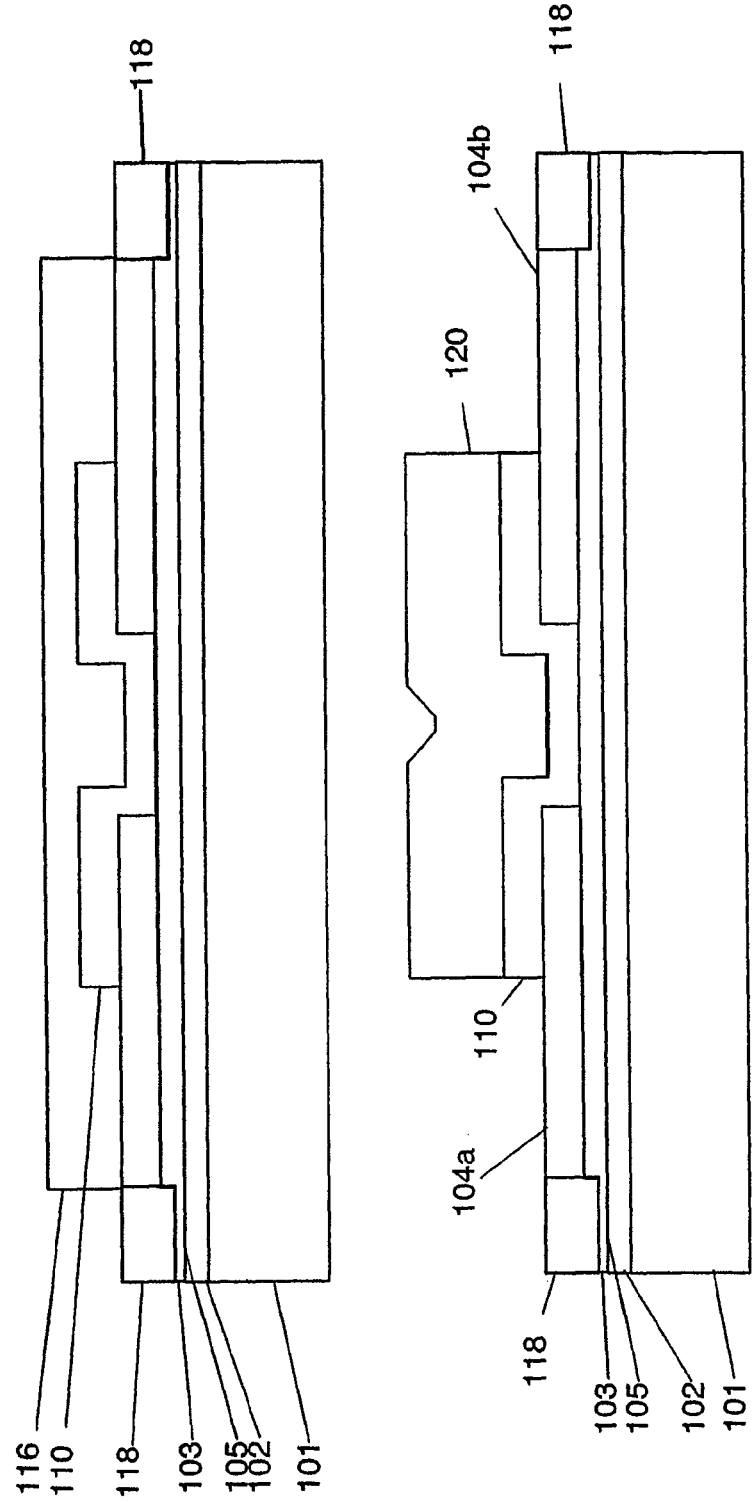

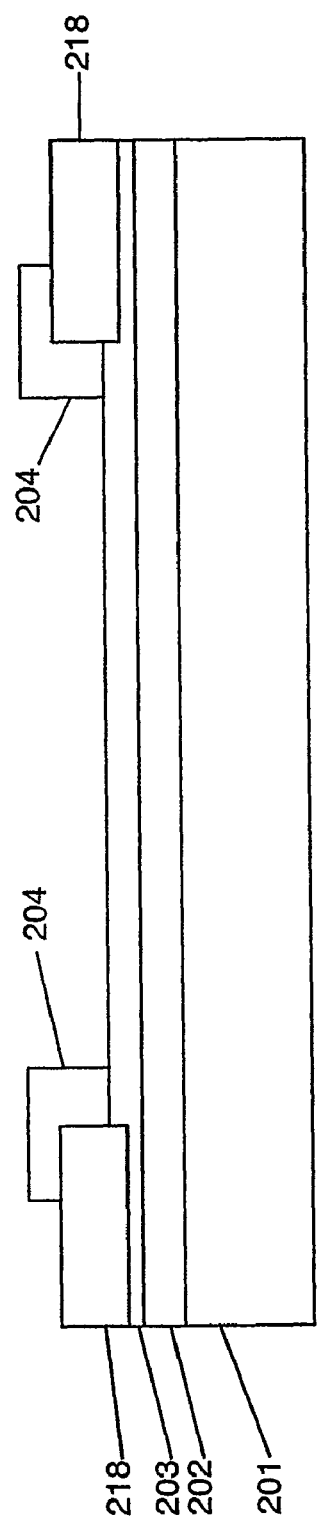

OHMIC METAL CONTACT PROTECTION USING AN ENCAPSULATION LAYER

CROSS REFERENCE TO RELATED APPLICATIONS

This application is a divisional of prior U.S. patent application Ser. No. 10/964,875, filed on Oct. 13, 2004, which is a divisional of U.S. patent application Ser. No. 10/634,348, filed on Aug. 4, 2003, now U.S. Pat. No. 6,884,704, which claims the benefit of U.S. Provisional Application No. 60/401,414, filed Aug. 5, 2002, the contents of which are incorporated by reference herein.

The present document is also related to the co-pending and commonly assigned patent application documents entitled "A Process for Fabricating Ultra-Low Contact Resistances In GaN Based Devices," U.S. Ser. No. 60/401,415, and "GaN/AlGaN Heterostructure Field Effect Transistor with Dielectric Recessed Gate," U.S. Ser. No. 10/214,422 which were filed on even date. The contents of these related applications are hereby incorporated by reference herein.

FIELD

The present invention relates to a new method for protecting a semiconductor device. More specifically, the present invention relates to a method for protecting the ohmic metal contacts and the channel of a device when the device is exposed to the high temperatures needed for alloying the ohmic metal contacts.

BACKGROUND

Semiconductor device fabrication that involves alloying ohmic metal contacts is a technique used for fabricating devices with low contact resistance in the ohmic metal contacts. However, temperatures in excess of 800.degree. C. are typically necessary for alloying ohmic metal contacts for Group III-nitride material devices. However, exposure to such high temperatures creates problems within the channel of the device as well as with the ohmic metal contacts themselves.

Fabrication of low noise devices requires a narrow separation of the source and drain of the transistor. In gallium-nitride (GaN) technology and Group III-nitride technology, achieving a narrow separation between the source and drain becomes difficult due to the high temperature processing step of alloying the source and drain ohmic metal contacts. In general, the ohmic metal contacts have smooth edges, but when exposed to high temperatures, the edges become jagged. In addition, the high temperatures cause the edges of the ohmic metal contacts to move in an uncontrollable manner. These problems place a lower limit on the design of the source-drain separation.

Previously, attempts have been made at fabricating low resistance ohmic metal contacts. In one process, a substrate 5 is provided and a semiconductor layer 10 is deposited on the substrate 5. Next, the source-drain regions are etched in the semiconductor layer 10 using chlorine plasma in a reactive ion etching system. The ohmic metal contacts 20 for the source and drain contact pads, as shown in FIG. 1a, are then deposited on the semiconductor layer 10. The source-drain separation in this procedure is generally about 2 .mu.m. Then, the ohmic metal contacts 20 are annealed for 30 seconds at 875.degree. C. in a nitrogen ambient. This technique helps reduce the resistance of the ohmic metal contacts 20. However, the process does not provide a method for protecting the structure of the ohmic metal contacts 20 from the high temperatures during the annealing process. After the ohmic metal contacts 20 are exposed to the high temperatures, as shown in FIG. 1b, the edges become jagged and the ohmic metal contacts 20 begin to migrate and creep towards one another in an uncontrollable manner. The problem with ohmic metal migration is that it places a lower limit on the design of the device. Typically, the ohmic metal contacts are deposited on the source and drain of a semiconductor device with a desired distance of about 1 micrometer between the source and drain. However, the source and drain may need to be moved further apart to account for the unpredictable migration of the ohmic metal contacts. As a result, it is not always possible to obtain a 1 micrometer separation between the source and drain.

Another problem associated with the high temperatures needed for alloying ohmic metal contacts is that the electron mobility in the channel of transistors is severely reduced when the channel is exposed to high temperatures. Although the physical phenomenon causing the reduction in mobility is unknown, the problem has been experimentally determined. This problem ultimately slows down the speed of the device. In "GaN/AlGaN Heterostructure Field Effect Transistor with Dielectric Recessed Gate," U.S. Ser. No. 10/214,422 a method for forming a gate recessed into a silicon-nitride (SiN) film is taught. The purpose of this technique is to lower the parasitic resistance of the gate. Using this technique, a substrate 40 is provided and a buffer layer 50 is deposited on the substrate 40. Then, a first and second semiconductor layer 60, 70 are deposited. The first and second semiconductor layers will serve as the channel of the device. The first semiconductor layer 60 is typically GaN, and the second semiconductor layer is typically AlGaN. Finally, a dielectric layer 80, typically SiN, is deposited on the second semiconductor layer 70. A portion of the dielectric layer 80 and second semiconductor layer 70 is removed. Next, ohmic metal contacts 90, as shown in FIG. 2a, are deposited and alloyed at about 875.degree. C. After alloying, the dielectric layer 80 is recessed and a gate 95 is deposited as shown in FIG. 2b. As can be seen in FIGS. 2a and 2b, the ohmic metal contacts for the source and drain are still partly exposed. During subsequent high temperature processing the ohmic metal contacts 90 may creep towards each other. Furthermore, patterning a SiN dielectric layer 80 for gate 95 deposition is extremely difficult and unpractical after the SiN dielectric layer 80 has been exposed to the high alloying temperatures. The technique used to pattern the SiN dielectric layer 80 is likely to cause damage to the second semiconductor layer 70 underneath the gate 95, thereby degrading the performance characteristics of the channel in the semiconductor device.

Therefore, there is a need for a method of fabricating a semiconductor device that can protect the ohmic metal contacts from high temperatures, resulting in the migration of the ohmic metal contacts. There is also a need for a method of fabricating a semiconductor device that can protect the channel and maintain the performance characteristics of the channel in the semiconductor device when the device is exposed to high temperatures.

SUMMARY

In one aspect the present invention provides semiconductor device comprising: a substrate; at least one semiconductor layer deposited on the substrate; at least one alloyed ohmic metal contact disposed on the at least one semiconductor layer, the alloyed ohmic metal contact having a horizontally arranged first surface and a vertically disposed first edge; and an encapsulation layer, the encapsulation layer deposited on at least a portion of the vertically disposed first edge and on at least a portion of the horizontally arranged first surface of the at least one alloyed ohmic metal contact, the encapsulation layer further being disposed on said at least one semiconductor layer and wherein the encapsulation layer prevents migration of ohmic metal in the at least one alloyed ohmic metal contact when the at least one alloyed ohmic metal contact is alloyed.

In another aspect the present invention provides a semiconductor device comprising: a substrate; at least one semiconductor layer disposed on the substrate; at least one alloyed ohmic metal contact disposed on the at least one semiconductor layer, the alloyed ohmic metal contact having first and second surfaces, the first and second surface being orthogonally disposed with respect to one another; and an encapsulation layer, the encapsulation layer disposed on at least a portion of the first surface of at least one alloyed ohmic metal contact and also disposed on at least a portion of the second surface of at least one alloyed ohmic metal contact, the encapsulation layer further being disposed on at least a portion of the at least one semiconductor layer and wherein the encapsulation layer inhibits migration of ohmic metal in the alloyed ohmic metal contact when the at least one alloyed ohmic metal contact is alloyed

BRIEF DESCRIPTION OF DRAWINGS

FIG. 2b depicts a further processing step for the device shown in FIG. 2a.

FIG. 3d shows FIG. 3b with the photoresist layer removed.

FIG. 3e shows the refractory metal layer deposited in the opening.

FIG. 3f shows a photoresist layer deposited on the refractory metal layer.

FIG. 3j shows the deposition of the ohmic metal contacts.

FIG. 3k shows the deposition of the gate metal layer.

FIG. 4d shows the encapsulation layer deposited on the ohmic metal contacts.

DETAILED DESCRIPTION OF PREFERRED EMBODIMENTS

The present invention will now be described more fully hereinafter with reference to the accompanying drawings, in which preferred embodiments of the invention are shown. This invention may be embodied in many different forms and should not be construed as limited to the embodiments set forth herein.

First Embodiment

Figure 1A:
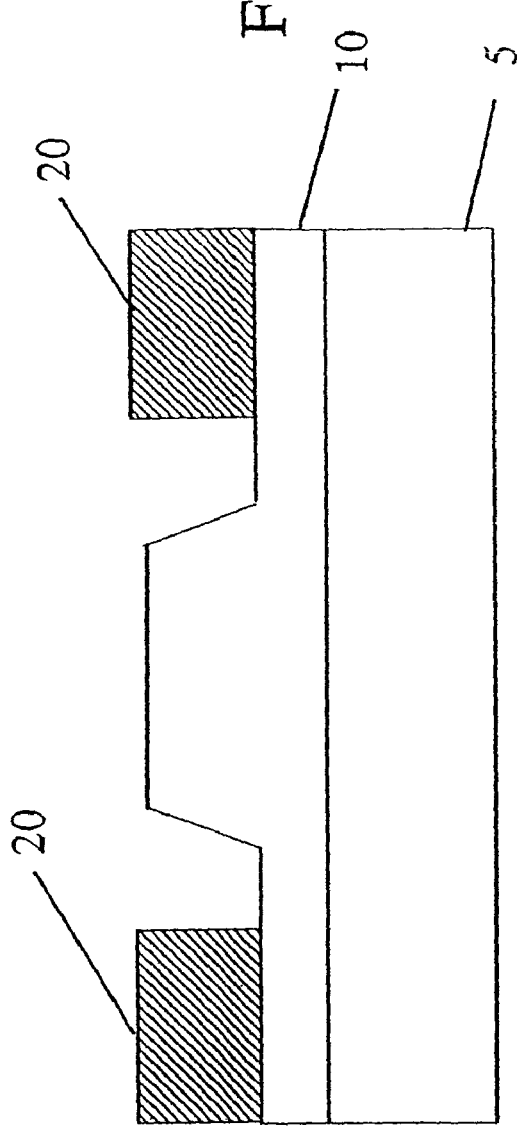
FIG. 1a depicts a prior art device with deposited ohmic metal contacts.
Figure 1B:
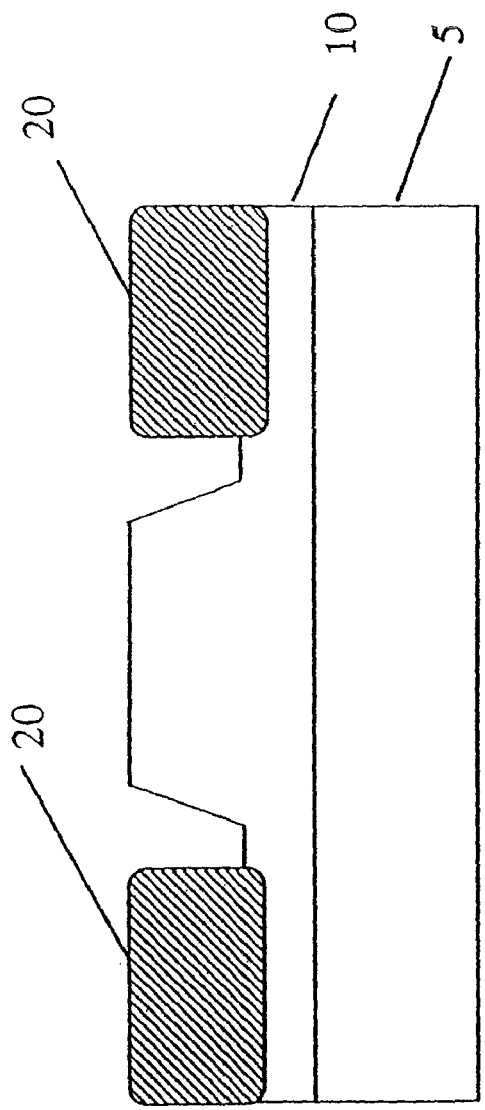
FIG. 1b depicts the prior art device shown in FIG. 1a after exposure to the high temperature.
Figure 2B:
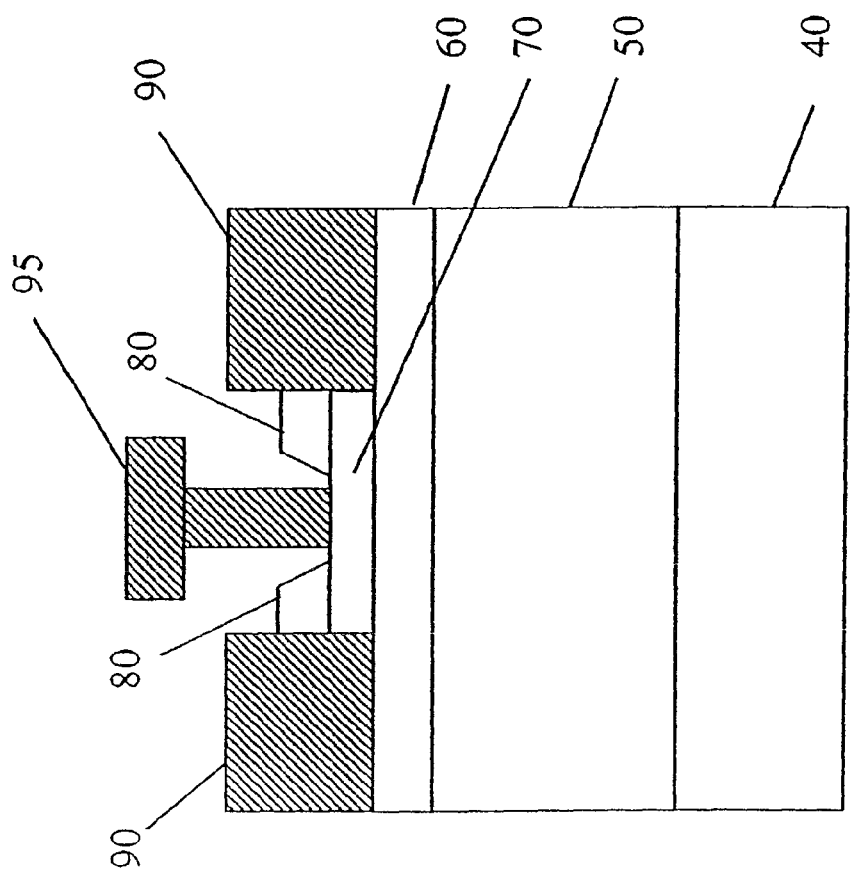
Figure 2A:
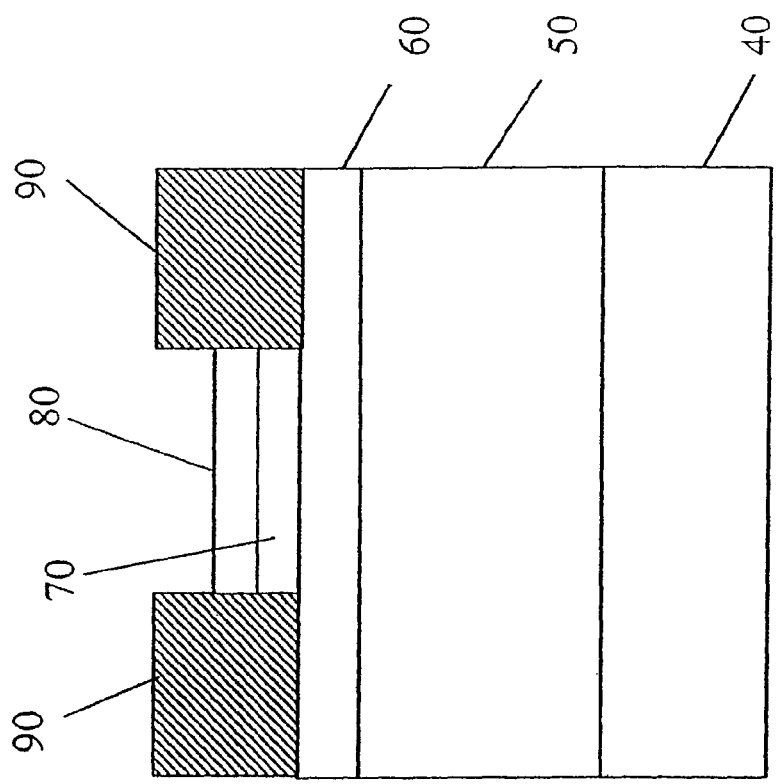
FIG. 2a depicts a step in a prior art method for forming a GaN device.
Figure 3A:
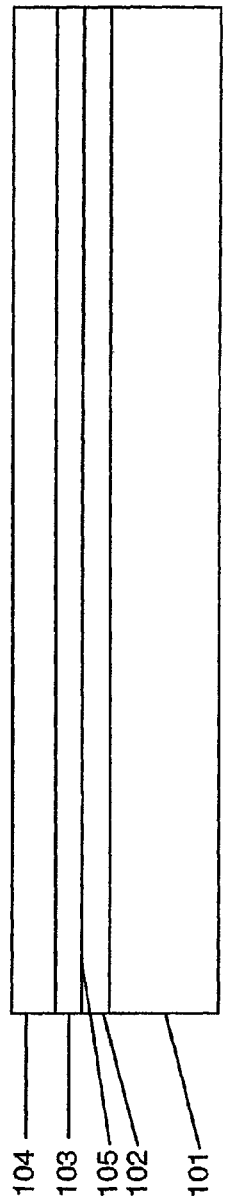
FIG. 3a shows a substrate with the plurality of layers and the encapsulation layer.

A method and apparatus for protecting the ohmic metal contacts and channel of a semiconductor device according to a first embodiment of the present invention is described with reference to FIGS. 3a-3k. Referring to FIG. 3a, a substrate 101, preferably comprised of silicon carbide (SiC), is provided. Next, a first layer 102, preferably comprised of GaN and preferably fabricated using molecular beam epitaxy, is deposited on the substrate 101. A second layer 103, preferably comprised of AlGaN and fabricated using molecular beam epitaxy, is deposited on the second layer 102. An interface 105 is created between the first layer 102 and the second layer 103. The interface 105 serves as the channel of the semiconductor device. An encapsulation layer 104, preferably comprised of SiN, is deposited on the surface of the second layer 103. The encapsulation layer 104 has a thickness typically in the range of 50-200 nanometers, but is preferably 100 nanometers thick.

Figure 3B:
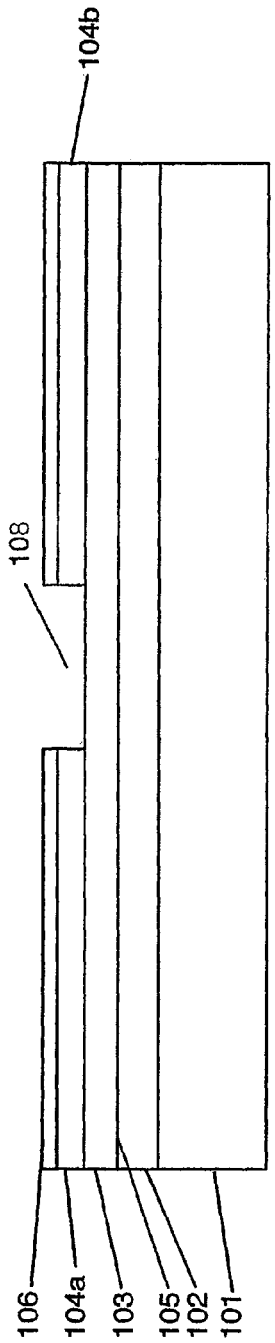
FIG. 3b shows a substrate with the plurality of layers and the patterned encapsulation layer.
Figures 1, 3C:
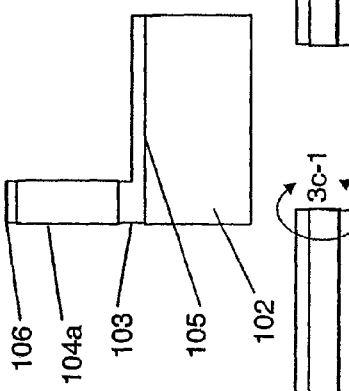
FIGS. 3c and 3c-1 show a further optional step of 3b.
Figure 3C:
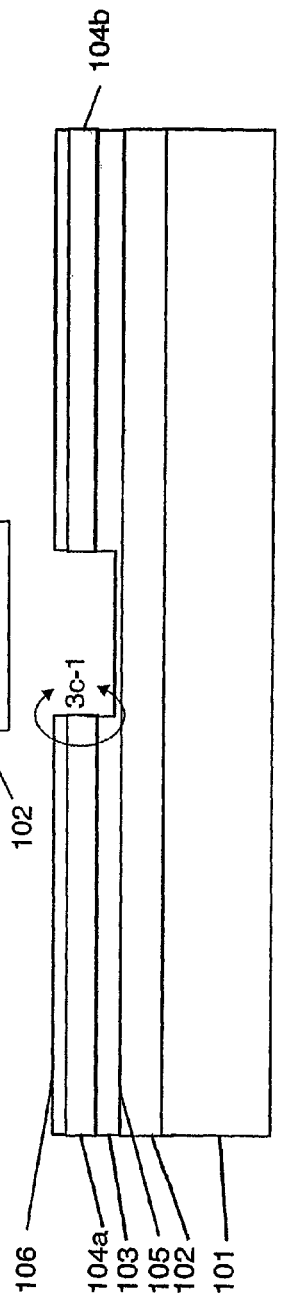

Next, as shown in FIGS. 3b-3c, 3c-1, and 3d, a first opening 108 for a gate structure is formed. First, a first layer of photoresist 106, preferably electron-sensitive photoresist, is deposited on the exposed SiN layer 104 as shown in FIG. 3b. Electron beam lithography is used to pattern and remove at least a portion of the electron-sensitive photoresist layer 106 and the encapsulation layer 104, thereby creating the first opening 108, as shown in FIG. 3b, which exposes the surface of the second layer 103. Optionally, as shown in FIG. 3c and in even greater detail in FIG. 3c-1, a portion of the second layer 103 may also be removed using reactive ion etching. The removal of a portion of the encapsulation layer 104, leaves two separate encapsulation layers 104a, 104b. The first opening 108 exposes a portion of the second layer 103 and is created by the separation of the encapsulation layers 104a, 104b. After the first opening 108 is created, the remaining portion of the electron-sensitive photoresist layer 106 is removed, as shown in FIG. 3d, using techniques known in the art.

Next, as shown in FIG. 3e, a refractory metal layer 110, preferably comprised of molybdenum (Mo), tungsten (W), or tungsten silicide, is deposited on the surface of the remaining encapsulation layers 104a, 104b and in the first opening 108. The refractory metal layer 110 typically has a thickness in the range of 100-400 nanometers, but is preferably 100 nanometers thick. Optionally, a thin layer of platinum (Pt) or titanium (Ti) (not shown) may be applied over the refractory metal layer 110 to help promote the adhesion of a gold layer, which is discussed later.

The refractory metal layer 110, which is deposited in the first opening 108 makes direct contact with the surface of the second layer 103. The portion of the refractory metal layer 110 deposited on the encapsulation layers 104a, 104b extends partially over the edge of the encapsulation layers 104a, 104b to make contact with the refractory metal layer 110 deposited in the first opening 108. The partial extension over the edge creates a second opening 112 directly above the portion of the refractory metal contacting the second layer 103. This refractory metal layer 110 will eventually become the gate of the device.

Figure 3G:
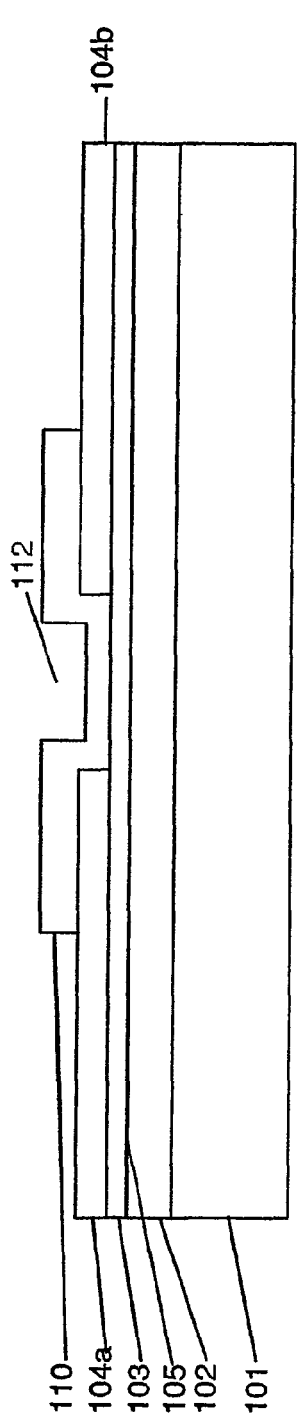
FIG. 3g shows a portion of the refractory metal layer patterned and removed.

As shown in FIG. 3f, a second layer of photoresist 114, preferably for optical photolithography, is deposited on a portion of the refractory metal layer 110 and in the second opening 112. The portion of the refractory metal layer 110 not covered by the photolithography photoresist 114 is removed, as shown in FIG. 3g, using techniques known in the art, such as a CF.sub.4 dry etch. After the desired portion of the refractory metal layer 110 has been removed, the optical photolithography photoresist 114 is removed using techniques known in the art.

Figure 3H:
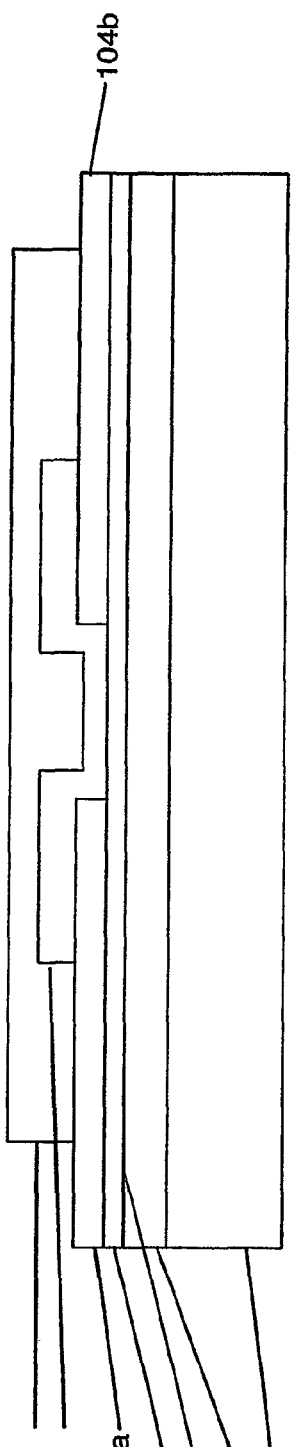
FIG. 3h shows a photoresist layer deposited on the refractory metal layer.
Figure 3I:
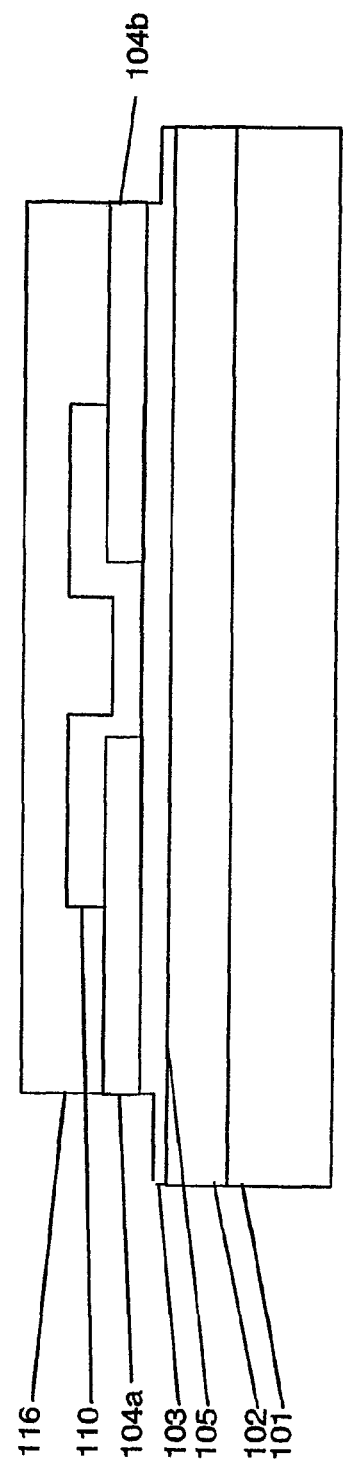
FIG. 3i shows a portion of the encapsulation layer and plurality of layers removed.

The next step is the formation of ohmic metal contacts 118 for the device (shown in FIGS. 3j and 3k). As shown in FIG. 3h, a third layer of photoresist 116, preferably for photolithography, is deposited to cover all the exposed refractory metal layer 110 and a portion of the encapsulation layers 104a, 104b. The area of encapsulation layers 104a, 104b that remain exposed will be removed to create regions where the ohmic metal contacts 118 will be deposited. In this embodiment, the spacing between the ohmic metal contacts 118 is as low as 1 micrometer apart. Techniques known in the art, such as reactive ion etching using CF.sub.4 or Cl gas, are used to etch away the exposed portion of the encapsulation layers 104a, 104b, as well as a portion of the second layer 103 as shown in FIG. 3i.

Ohmic metal contacts 118, preferably comprising a combination of titanium (Ti), aluminum (Al), nickel (Ni), and gold (Au), are deposited on the second layer 103, as shown in FIG. 3j in the regions where a portion of the encapsulation layer 104a, 104b, and second layer 103 were removed. Next, the third layer of photoresist 116 is removed using techniques known in the art. If any ohmic metal was deposited on the third layer of photoresist 116 during deposition of the ohmic metal contacts 118, that ohmic metal will be removed when the third layer of photoresist 116 is removed. After the ohmic metal contacts 118 are deposited, the device is heated to temperatures in excess of 800.degree. C., in order to alloy the ohmic metal contacts 118. The encapsulation layers 104a, 104b form a dam to prevent the flow or migration of ohmic metal during the high temperature alloying process. Furthermore, the remaining encapsulation layers 104a, 104b protects the interface 105 against a reduction in electron mobility during the alloying.

After alloying the ohmic metal contacts 118, a gate contact 120, preferably comprising gold, is deposited on the remaining refractory metal layer 110 and in the second opening 112, as shown in FIG. 3k. The gate contact 120 helps to reduce the resistance of the gate of the transistor.

Second Embodiment

Figure 4A:
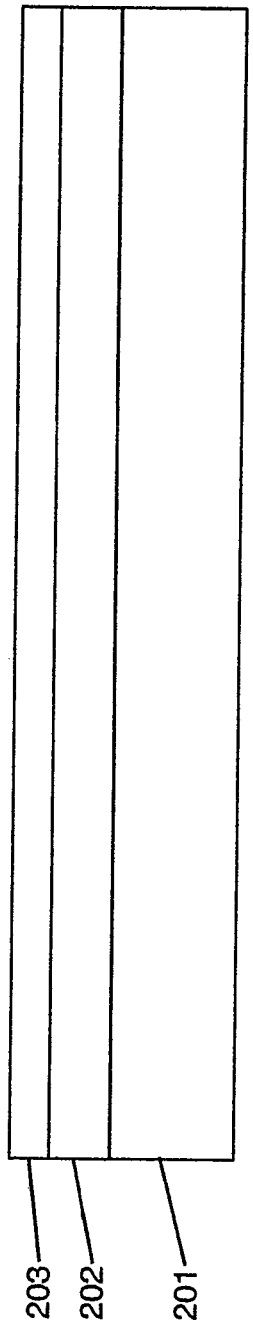
FIG. 4a shows a substrate with the plurality of layers of semiconductor material
Figure 4B:
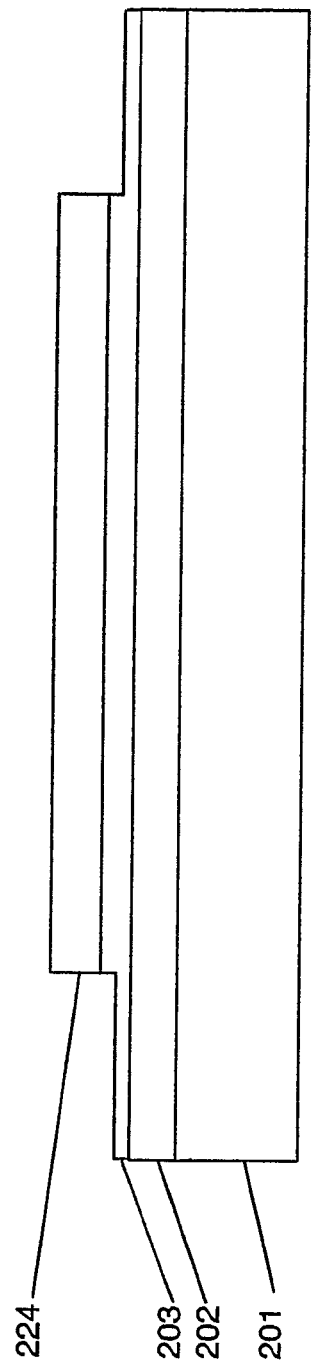
FIG. 4b shows the photoresist on the second layer, and a portion of the second layer removed.

A method and apparatus for protecting the ohmic metal contacts of a semiconductor device according to a second embodiment will now be described and is shown in FIGS. 4a-4d. In this second embodiment, a substrate 201, preferably comprising silicon-carbide (SiC), is provided. The first layer 202, preferably comprising GaN, and the second layer 203, preferably comprising AlGaN, are deposited on the substrate 201 as shown in FIG. 4a. Next, a layer of photoresist 224, preferably for optical lithography, is deposited on the second layer 203. The photoresist layer 224 is patterned and a portion of the second layer 203 is removed as shown in FIG. 4b, using techniques known in the art such as RIE with CF.sub.4 or Cl.sub.2 gas.

Figure 4C:
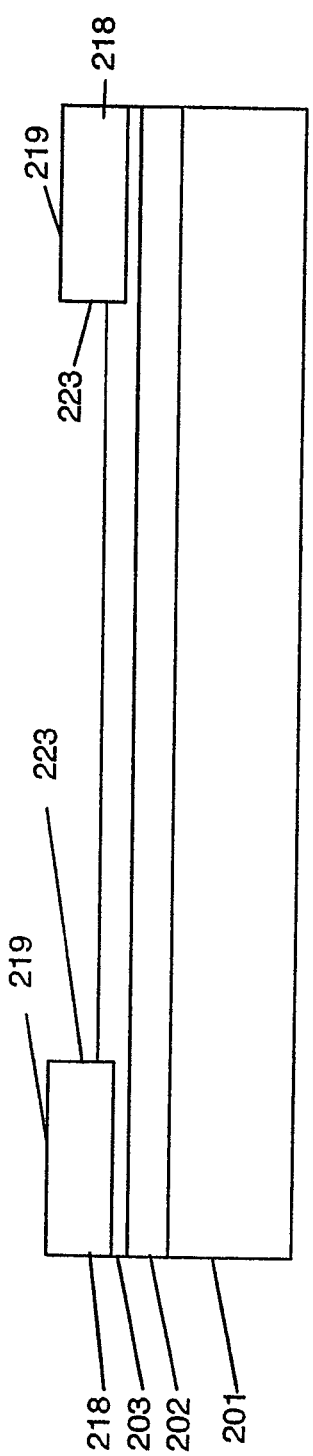
FIG. 4c shows the deposition of the ohmic metal contacts.

Next, ohmic metal contacts 218 are deposited on the first layer 202, as shown in FIG. 4c. The ohmic metal contacts 218 have first surfaces 219 and first edges 223. After the ohmic metal contacts 218 are deposited, an encapsulation layer 204, preferably comprising SiN, is deposited on a portion of the first surfaces 219 of the ohmic metal contacts 218 in a manner as to cover the first edges 223 of the ohmic metal contacts, as shown in FIG. 4d. The SiN layer 204 may be in the range of 50-200 nanometers, but is preferably about 100 nanometers thick. It is preferable to deposit the least amount of the SiN layer 204 on the first surfaces 219 of the ohmic metal contacts 218, as shown in FIG. 4d. The ohmic metal contacts 218 are preferably comprised of a combination of titanium (Ti), aluminum (Al), nickel (Ni), and gold (Au). After the ohmic metal contacts 218 have been deposited, the ohmic metal contacts 218 are alloyed at preferably 850.degree. C. for approximately 30 seconds to reduce their resistance.

The encapsulation layer on the first edges 223 of the ohmic metal contacts 218 will help prevent the first edges 223 of the ohmic metal contacts 118 from becoming rough or moving while exposed to the high temperatures needed to alloy the ohmic metal contacts 218.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A semiconductor device comprising:
    a substrate;
    at least one semiconductor layer deposited on the substrate;
    at least one alloyed ohmic metal contact disposed on the at least one semiconductor layer, the alloyed ohmic metal contact having a horizontally arranged first surface and a vertically disposed first edge; and
    an encapsulation layer, the encapsulation layer deposited on at least a portion of the vertically disposed first edge and on at least a portion of the horizontally arranged first surface of the at least one alloyed ohmic metal contact, the encapsulation layer further being disposed on said at least one semiconductor layer and wherein the encapsulation layer prevents migration of ohmic metal in the at least one alloyed ohmic metal contact when the at least one alloyed ohmic metal contact is alloyed.

2. The apparatus of claim 1, wherein the substrate comprises SiC.

3. The apparatus of claim 1, wherein the encapsulation layer comprises SiN.

4. The apparatus of claim 1, wherein the at least one semiconductor layer comprises a first layer, the first layer comprising GaN.

5. The apparatus of claim 4, wherein the at least one layer further comprises a second layer deposited over the first layer, the second layer comprising AlGaN.

6. The apparatus of claim 1, wherein the encapsulation layer has a thickness in the range of 50-200 nanometers.

7. The apparatus of claim 5, wherein a portion of the second layer is removed, and wherein the alloyed ohmic metal contacts are deposited in the region where the portion of the second layer is removed.

8. The apparatus of claim 1, wherein the alloyed ohmic metal contacts comprise a combination of titanium, aluminum, nickel, and gold.

9. The apparatus of claim 1, wherein the alloyed ohmic metal contacts are alloyed by exposure to a temperature of at least 800° C. for at least 30 seconds.

10. The apparatus of claim 1 wherein a first portion of the encapsulation layer is disposed adjacent the vertically disposed first edge of the at least one alloyed ohmic metal contact and wherein a second portion of the encapsulation layer is disposed over the horizontally arranged first surface of the at least one alloyed ohmic metal contact.

11. The apparatus of claim 10 wherein a thickness of the first portion of the encapsulation layer is greater than a thickness of the second portion of the encapsulation layer.

12. A semiconductor device comprising:
a substrate;
at least one semiconductor layer disposed on the substrate;
at least one alloyed ohmic metal contact disposed on the at least one semiconductor layer, the alloyed ohmic metal contact having first and second surfaces, the first and second surface being orthogonally disposed with respect to one another; and
an encapsulation layer, the encapsulation layer disposed on at least a portion of the first surface of at least one alloyed ohmic metal contact and also disposed on at least a portion of the second surface of at least one alloyed ohmic metal contact, the encapsulation layer further being disposed on at least a portion of the at least one semiconductor layer and wherein the encapsulation layer inhibits migration of ohmic metal in the alloyed ohmic metal contact when the at least one alloyed ohmic metal contact is alloyed.

13. The apparatus of claim 12, wherein the substrate comprises SiC.

14. The apparatus of claim 12, wherein the encapsulation layer comprises SiN.

15. The apparatus of claim 12, wherein the at least one semiconductor layer comprises a first layer, the first layer comprising GaN.

16. The apparatus of claim 15, wherein the at least one layer further comprises a second layer deposited over the first layer, the second layer comprising AlGaN.

17. The apparatus of claim 12, wherein the encapsulation layer has a thickness in the range of 50-200 nanometers.

18. The apparatus of claim 16, wherein a portion of the second layer is removed, and wherein the alloyed ohmic metal contacts are deposited in the region where the portion of the second layer is removed.

19. The apparatus of claim 12, wherein the alloyed ohmic metal contacts comprise a combination of titanium, aluminum, nickel, and gold.

20. The apparatus of claim 12 wherein the first surface of the at least one alloyed ohmic metal contact is vertically disposed and the second surface of the at least one alloyed ohmic metal contact is horizontally disposed, the first and second surfaces of the at least one alloyed ohmic metal contact intersecting each other at an edge, and wherein a first portion of the encapsulation layer is disposed adjacent the vertically disposed first surface and along said edge of the at least one alloyed ohmic metal contact and wherein a second portion of the encapsulation layer is disposed over the horizontally arranged second surface and along said edge of the at least one alloyed ohmic metal contact.

21. The apparatus of claim 20 wherein a thickness of the first portion of the encapsulation layer is greater than a thickness of the second portion of the encapsulation layer.

* * * * *